United States Patent [19]
Catt

[11] Patent Number: 5,055,774
[45] Date of Patent: Oct. 8, 1991

[54] INTEGRATED CIRCUIT INTEGRITY TESTING APPARATUS

[76] Inventor: Ivor Catt, 15 King Harry Lane, St. Albans, Herts AL3 3AS, United Kingdom

[21] Appl. No.: 458,612
[22] PCT Filed: Jul. 15, 1988
[86] PCT No.: PCT/GB88/00570
§ 371 Date: Jan. 16, 1990
§ 102(e) Date: Jan. 16, 1990
[87] PCT Pub. No.: WO89/00728
PCT Pub. Date: Jan. 26, 1989

[30] Foreign Application Priority Data
Jul. 17, 1987 [GB] United Kingdom ................. 8716849
Jan. 7, 1988 [GB] United Kingdom ................. 8800253

[51] Int. Cl.$^5$ ........................................... G01R 31/28
[52] U.S. Cl. .............................. 324/158 R; 324/73.1; 371/11.1; 371/22.1
[58] Field of Search ......................... 324/73.1, 158 R; 371/10.1, 11.1, 11.3, 22.1, 22.6; 365/200, 201

[56] References Cited
U.S. PATENT DOCUMENTS
4,038,648  7/1977  Chesley ............................. 324/73.1
4,254,477  3/1981  Hsia et al. ......................... 371/10.1
4,398,248  8/1983  Hsia et al. ......................... 371/11.1
4,868,789  9/1989  MacDonald ....................... 371/11.1

FOREIGN PATENT DOCUMENTS
1131085  10/1968  United Kingdom .

OTHER PUBLICATIONS
Proceedings of the IEEE International Conference on Computer Design: VSLI in Computers, 6–9 Oct. 1986; Port Chester, New York, IEEE, (New York, U.S.), V. K. Agarwal et al.: "Techniques for Implementing Large Area Devices", pp. 220–224 See P. 220, Left-Hand Column, Line 46-Right-Hand Column, Line 2; p. 222, Left-Hand Column, Line 29-Right-Hand Column, Line 60.
Systems Technology, No. 31, Apr. 1979, (Liverpool, GB), G. Edge: "Fault Diagnosis in Computer Control Systems":, pp. 33–41 See P. 35, Left-Hand Column, Lines 51-61.
Proceedings of the 8th Annual Symposium on Computer Architecture, 12–14 May 1981, Minneapolis, Minnesota, IEEE.
IEEE Proceedings-E/Computers Digital Techniques 134 (1987) Mar., 2, Part E Stebenage Herts, Great Britain "Techniques for Implementing Two Dimensional Wafer-Scale Processors or Rays", Jesshope et al.
IEEE Journal of Solid-State Circuits, vol. SC-15, No. 3 Jun. 1980 "Built-In Test for Complex Digital Integrated Circuits", Konemann, et al.

Primary Examiner—Ernest F. Karlsen
Attorney, Agent, or Firm—Davis, Bujold & Streck

[57] ABSTRACT

Each component circuit of an LSI wafer includes a kernel logic section that checks the integrity of the circuit to which it belongs according to a step-by-step process by which progressively larger portions of the circuit are tested. Logic tested during one step is involved in the next step, and once testing of the component circuit is completed, it is extended to testing adjacent circuits of the wafer. Detection of a fault at any stage results in isolation of the faulty circuit or part of it. Test programs and data are stored in ROM within the component circuit, or are supplied via wires bonded to the wafer, for storage in RAM. On completion of the testing, configuration logic within the circuits interconnects the good circuits in an array for communication of signals between them. The kernel logic may be shared between groups of component circuits.

17 Claims, 4 Drawing Sheets

INTEGRATED CIRCUIT INTEGRITY TESTING APPARATUS

This invention relates to integrated circuits of the kind in which a multiplicity of semiconductor regions of a unitary substrate each contain a circuit that is adapted to store and/or process data and to transfer signals to, and to receive signals from, others of the circuits, a control condition is derived in dependence upon signal responses that occur within the individual circuits according to the integrity of circuitry within those circuits, and interconnections of the circuits with one another for the purposes of the transfer and reception of signals between the circuits are enabled or disabled in dependence upon the derived control condition.

Integrated circuits of this kind are known from UK Patent Specification No. 1,377,859. In UK Patent Specification No. 1,377,859 there is described an integrated circuit in which a multiplicity of regions of a unitary semiconductor wafer-substrate each contain a circuit that is adapted to store and/or process data and to transfer data signals to, and to receive data signals from, others of the circuits. In particular, the construction of a multi-stage shift register is described, each of the circuits incorporating two sections of shift register that are interconnected serially with the corresponding sections of a multiplicity of other circuits on the wafer, in order to make up the complete, extended shift-register. The provision of the shift register in this way involves the progressive building up of a chain of the circuits connected in cascade with one another, each circuit being added in turn to extend the chain only following testing of the integrity of that circuit to make sure that it is not faulty. The testing is carried out in each case from an external unit that checks that digital words entered into the circuit via such of the chain as is already established, are returned from that circuit via the chain, without error. If there is error, the circuit under test is rejected by disabling the connection of that circuit in the chain, and the process of selection and testing repeated towards identifying another circuit for which there is no error. Once a no-error response has been achieved from a tested circuit, that circuit is added to extend the chain, and selection of another circuit for testing is made; provided this other circuit fulfills the requirement for circuit-integrity, it too is added to extend the chain further, and so on until the complete shift-register is built up.

Integrated circuits constructed and operated according to the technique disclosed in UK Patent Specification No. 1,377,859, have been found advantageous in practice. However, they have the disadvantages that the external circuit required to select and test the circuits, is generally complex and entails significant costs (possibly comparable with those involved in the provision of the wafer circuit itself), and the selection and testing process, in which each circuit is selected and tested in turn, takes significant time.

It is an object of the present invention to provide an integrated circuit of the kind specified that enables the above disadvantages to be overcome, or at least reduced.

According to the present invention there is provided an integrated circuit of the kind specified, characterised in that each said region, or at least each of a plurality of groups of said regions, includes logic circuitry individual to the respective region or group of regions for determining circuit integrity within that region or group and deriving said control condition, and that the said logic circuitry in each region or group acts to check the circuit integrity of that individual region or group, and thereby derive said control condition, according to a plurality of successive testing steps that involve progressively larger portions of the region or group and begin from at least a section of the logic circuitry without test of its integrity.

Thus, according to the present invention the individual component circuits, or the groups of such circuits, test themselves, rather than depending wholly on an external unit to test them in turn. The testing process can proceed in parallel within each circuit or group of circuits, and there is the advantage therefore, that it can be accomplished at a significantly higher speed than where the circuits are tested in turn.

The testing of the component circuits of an integrated circuit is generally considered to require, as in the case of the testing described in UK Patent Specification No. 1,377,859, involvement of a facility external to the integrated circuit, in order to give validity to the outcome. The use of self-testing is not prima facie acceptable, since where the circuit integrity is in doubt, the responses of that circuit concerning its own integrity cannot be relied upon as valid. The present invention approaches this issue, however, from the standpoint that with the advances made in integrated circuits and the high yields of good circuits obtained, it is possible to include in each component circuit, or group of such circuits, some limited amount of logic circuitry—or kernel logic, as it may be called—for which there would be a high probability of integrity, and which would be capable of carrying out at least initially, some rudimentary integrity-check on another portion of the component circuit or group of circuits. More especially, by suitable choice of such factors as circuit density and topography for this kernel logic, the likelihood of fault therein can be reduced to an extremely low order; area occupied by the kernel logic is a relevant factor also, and so is the type and quantity of circuitry used (adoption of serial logic, for example, tends to improve reliability). Since the kernel logic is in general only a small section of the complete component circuit or group of circuits, the choices made in maximizing its reliability, need not significantly affect the design choices available in the wider context of the integrated circuit as a whole.

In accordance with the present invention therefore, self-testing of the component circuits or groups of such circuits, proceeds from the assumed-good kernel logic, to test a portion of the component circuit or group of such circuits, and then on to test one or more progressively larger portions. As each step of the testing sequence is carried out, so it is possible to bring more and more of the just-tested logic and other parts of the circuit or group of circuits, into play in the testing process. Thus, as the testing proceeds so the sophistication and complexity of the testing carried out can increase as more of the circuitry becomes available for use. The result of the testing at each step will confirm or otherwise the results of earlier steps, and since a bad result will in general lead to the rejection of the component circuit as a whole, the issue of whether this bad result originates from a wrong assumption of integrity of the kernel logic, or a fault in the wider circuitry being tested, will not be relevant; the likelihood of there being faults in the kernel logic and in the remainder of the circuit that could lead to good results under repeated tests can, in general, be heavily discounted.

The validity of the test results achieved within the individual component circuits may be further checked by providing that the logic circuitry of each region or group of regions tests the integrity of the circuitry of one or more other regions, following completion of the testing of its own circuitry.

The logic circuitry of each region or group of regions may act for at least part of the sequence of testing steps, in accordance with program read from read-only memory within that region or group. Alternatively, the program may be supplied from a source external to that region or group, for example, from a control unit external to the integrated circuit; in particular, the program may be supplied via wires or other conductors bonded at intervals only, to the substrate of the integrated circuit.

The logic circuitry of the regions or groups of regions for which the integrity checks are satisfied, may respond to completion of the testing process to interconnect the circuits of those regions or groups in an array for transfer of signals to, and reception of signals from, one another in that array.

An integrated circuit in accordance with the present invention will now be described, by way of example, with reference to the accompanying drawings, in which.

The integrated circuit to be described incorporates some two hundred and fifty separate digital circuits laid down in respective regions on a single semiconductor wafer. For simplicity, and corresponding to what is disclosed in UK Patent Specification No. 1,377,859, the integrated circuit will be described in the context of the provision of one or more multi-stage shift registers, each made up by a chain of cascade-interconnected, component shift-register circuits laid down on the wafer. It should be understood however, that the invention is not limited in its application to such provision, and that the component circuits may have any functional form appropriate to the application in hand. In the latter respect furthermore, the circuits may be identical in configuration and function throughout the wafer, or there may be differences of configuration and/or function from one circuit or group of circuits to the next; for simplicity it will be assumed that all circuits on the wafer to be described, are identical in configuration and function.

Figure 1:
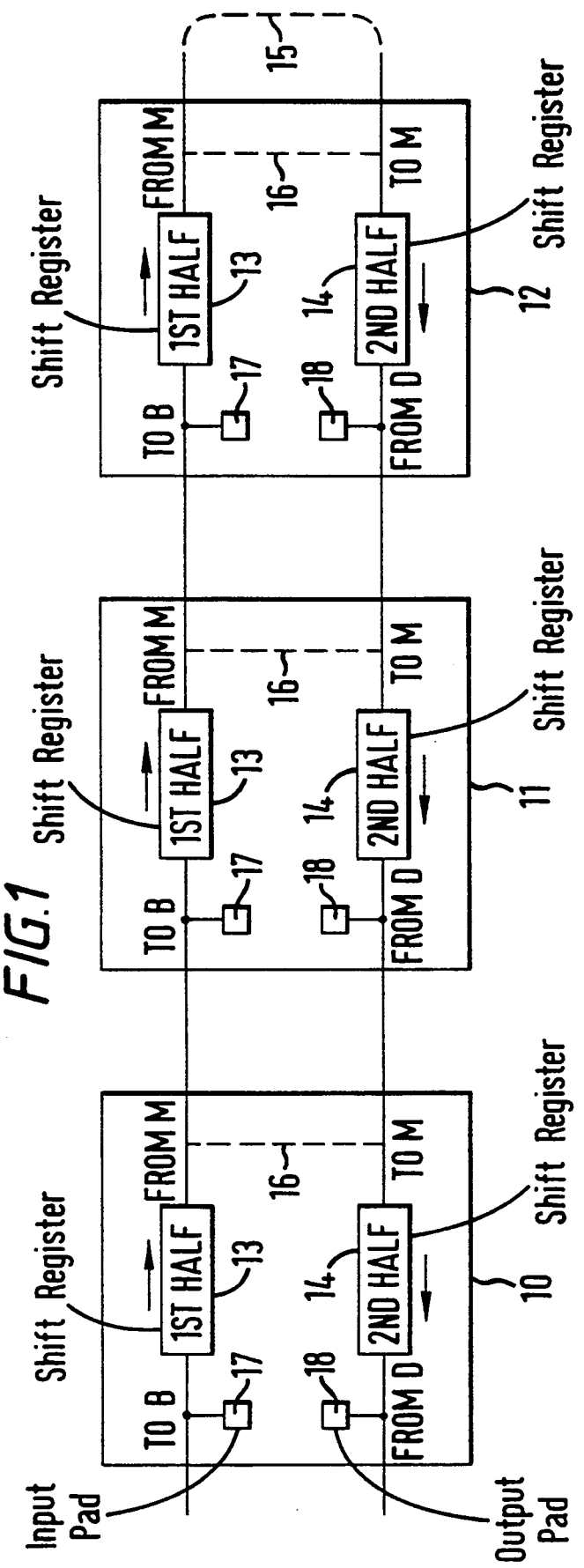
FIG. 1 illustrates schematically the manner in which component circuits of the integrated circuit are interconnected with one another in operation.

The general form of the component circuits, and the manner of their interconnection in cascade, is illustrated in FIG. 1, which shows just three such circuits.

Referring to FIG. 1, each of the three component circuits 10 to 12 includes a shift register that is split into two half sections 13 and 14. A composite shift register is formed by interconnecting the three component circuits 10 to 12 in cascade with one another and with other circuits of the wafer, to form a chain in which data is stepped from one to the other of the register sections 13 of all the interconnected circuits in turn, and at the end of the chain, as indicated at 15, is stepped back through the register sections 14 of those same circuits taken in the reverse order. Each circuit has a switched connection 16 for connecting the section 13 directly in series with the section 14, so as to enable the cross-connection represented as 15 to be put into effect in the last circuit of the chain. An input pad 17 and an output pad 18 are provided in each of the component circuits, and it is to the pads 17 and 18 of the first circuit of the chain that external data-signal connections are made to the composite shift register.

Data signals are received by the register sections 13 and 14 within each component circuit via input connections identified as TO B and TO M respectively, and are transferred from those register sections via respective output connections identified as FROM M and FROM D. Thus, as illustrated in FIG. 1, the FROM M connection of the circuit 10 is connected to the TO B connection of the circuit 11, and the FROM D connection of the circuit 11 is connected to the TO M connection of the circuit 10, in the cascade chain.

Only some of the connections to, and within, the component circuits are illustrated in FIG. 1, and such illustration shows only the functional part, that is to say, the part of each such circuit that is dedicated specifically to the provision of the shift-register function within the relevant circuit-defined region. In particular, there are additional connections for supplying power and clock and other signals to the circuits, and each circuit includes logic circuitry and memory facilities that whilst involved in the function, are also concerned in procedures for testing the integrity of the circuit and establishing its connection to and from adjacent circuits of the wafer. More especially in this latter respect, each component circuit includes gating circuitry for connecting the circuit to transfer data and other signals to any selected one of the four adjacent component circuits on the wafer, namely, to the one above, to the one to the right, to the one below and to the one to the left; gating circuitry is also included correspondingly for receiving data and other signals from any selected one of those same four adjacent component circuits. Thus, each component circuit rather than having just the four data-signal connections TO B, TO M, FROM M, and FROM D indicated in FIG. 1, has sixteen, there being four of each that are distinguished from one another according to whether they are to, or from, the component circuit above (identified as the direction N), to the right (identified as the direction E), below (identified as the direction S) or to the left (identified as the direction W); the four connections in each case are differentiated from one another by the letters N, E, S and W according to the directions of the respective circuits to which they are connected. The gating circuitry involved is illustrated in FIG. 2, and will now be described.

Figure 2:
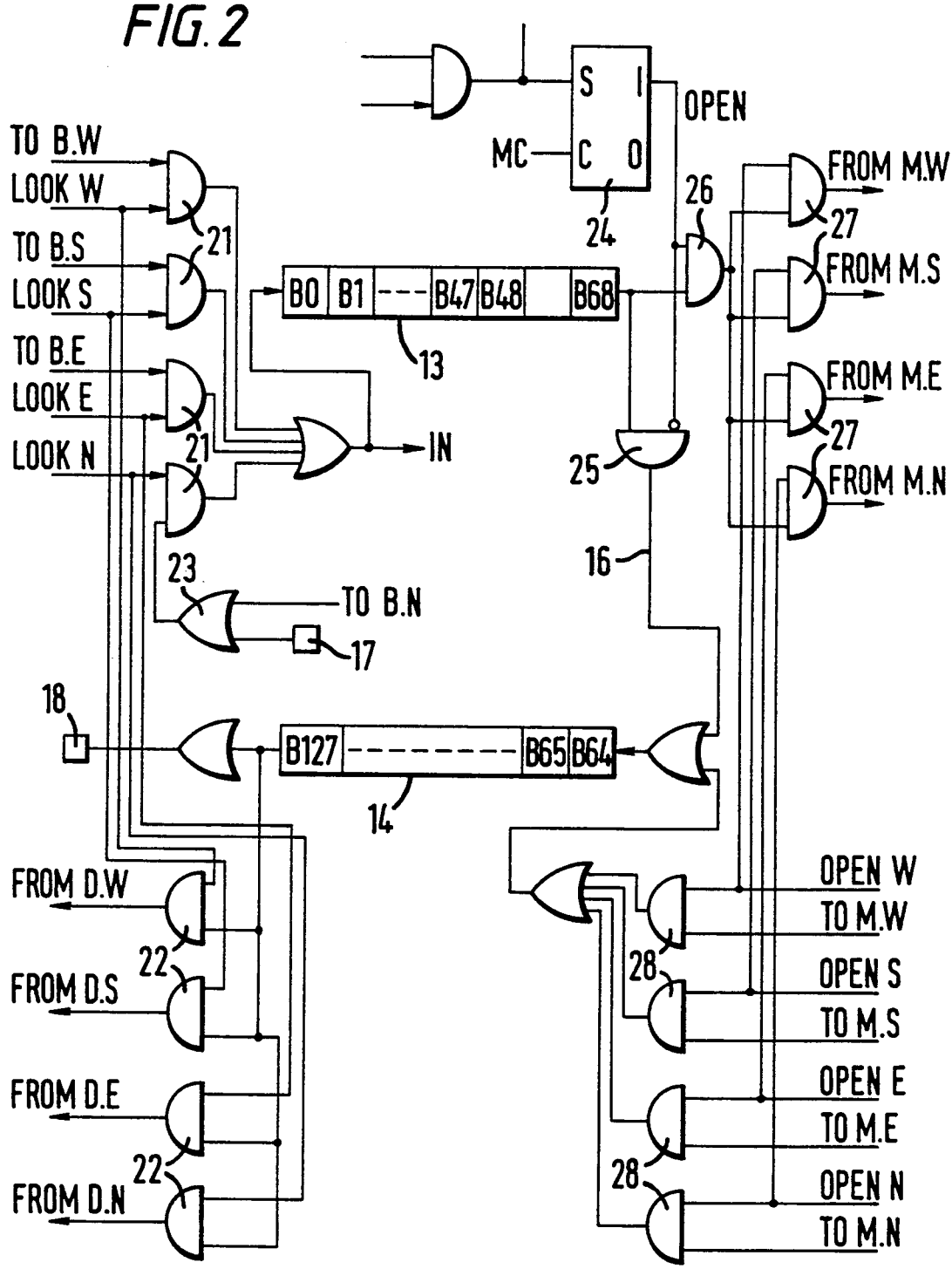
FIG. 2 is a circuit diagram of a functional part of one of the component circuits of the integrated circuit.

Referring to FIG. 2, there are four input gates 21, to which the input connections TO B from the directions N, E, S and W respectively, are connected, for feeding data to the first stage B0 of the shift-register section 13. The two shift-register sections 13 and 14 are illustrated here as having just sixty-four stages each, B0 to B63 and B64 to B127, and the output from stage B127 of the section 14 is connected to the pad 18 and also to four gates 22 that supply the FROM D connections to N, E, S and W respectively.

The input pad 17 is treated as if signals applied to it emanate from the direction N and in this respect it is combined with the TO B.N input connection via an OR gate 23.

In building up the chain of component circuits, each circuit is connected by its TO B and FROM D connections to the preceding circuit of the chain. This latter circuit has a known direction, N, E, S, or W with regard to the circuit under consideration, and the gates 21 and 22 appropriate to establishing connections in that direction are enabled by application to them of LOOK gating signals for that direction, namely, LOOK.N, LOOK.E, LOOK.S or LOOK.W.

If the component circuit is the last in the chain, its shift-register sections 13 and 14 are interconnected via the switched connection 16 under the control of a set-reset flip-flop 24. The flip-flops of all component circuits are initially reset, or cleared, by a master clear pulse MC applied to all the component circuits from an external control unit (not shown), so the flip-flop 24 is initially in the reset condition in which a gate 25 is enabled to complete the connection 16. Subsequent application of a control signal to the flip-flop 24 sets it to a condition in which it furnishes a signal OPEN, and the gate 25 is closed. A gate 26 opens in response to the signal OPEN, connecting the output of the first shift-register section 13 to whichever of four output gates 27 is enabled by a respective signal OPEN.N, OPEN.E, OPEN.S or OPEN.W. These latter signals also control input gates 28 for connecting TO M.N, TO M.E, TO M.S or TO M.W to the input of the second shift-register section 14.

Figure 3:
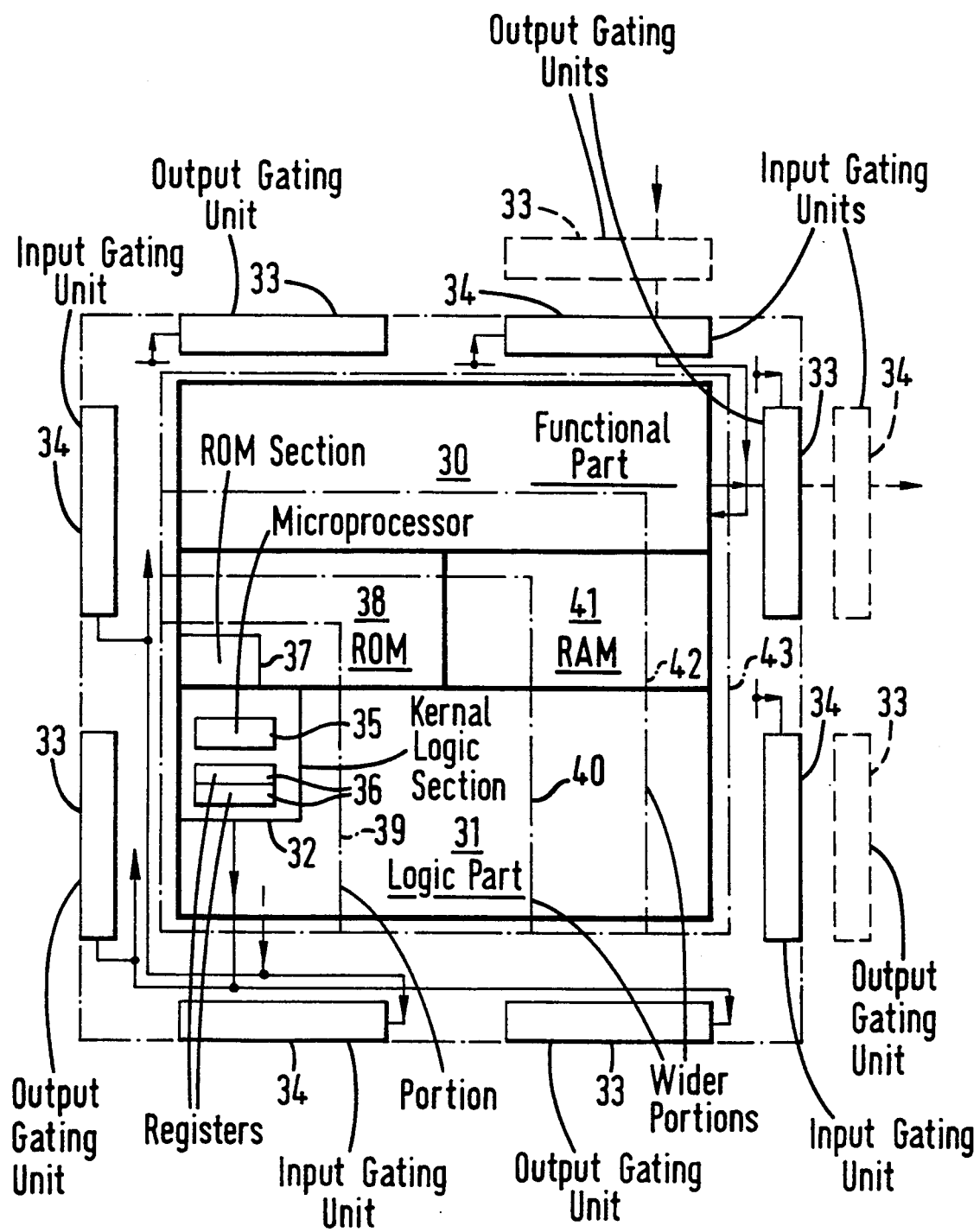
FIG. 3 is a schematic representation of a component circuit of the integrated circuit.

The control signals required to establish appropriate data-signal interconnections of the shift-register circuit with the shift-register circuits of other component circuits, are derived within logic circuitry of the component circuit. More particularly, the logic circuitry includes provision for generating and supplying the control signals LOOK.N, LOOK.E, LOOK.S and LOOK.W required to operate the gates 21 and 22, and the control signals OPEN.N, OPEN.E, OPEN.S and OPEN.W required to operate the gates 27 and 28, together with the control required for setting the flip-flop 24. The logic circuitry may in these respects take the form, and may operate, generally as described in UK Patent Specification No. 1,377,859, but in the present case it includes provision for self-testing. The functioning of the logic circuitry in this regard, and of the other constituent parts of a typical component circuit, will now be described with reference to FIG. 3. FIG. 3 shows one of the circuit-defined regions of the semiconductor substrate with the constituent parts of the circuit illustrated schematically.

Referring to FIG. 3, the component circuit includes, in addition to its functional part 30 (constituted, in this example, by the shift-register circuitry represented in FIG. 2), several levels of logic circuitry within a logic part 31. The logic part 31 of the circuitry includes, as a basic or kernel element, a logic section 32, and is connected to four output gating units 33 and to four input gating units 34, located along the four N, E, S and W boundaries of the region. The sixteen TO and FROM connections of the part 30 (only some of which are shown in FIG. 3) are connected via the units 33 and 34 to the matching connections of the four adjacent component circuits via corresponding units 34 and 33, respectively, of those adjacent circuits. The FROM M and FROM D connections supply data signals to the output gating units 33, and the TO B and TO M connections receive data signals from the gating units 34, appropriate to the identified directions N, E, S and W. For example, the connection FROM M.E is connected to the gating unit 33 on the E boundary of the region to supply data signals to the TO B.W connection of the circuit to the right (i.e. in the direction E) via the gating unit 34 of that latter circuit, whereas the TO M.N connection receives data signals via the gating unit 34 on the N boundary from the FROM D.S connection and gating unit 33 of the circuit above (i.e. in the direction N), and so on.

The kernel logic section 32 comprises a microprocessor 35 and registers 36 that operate serially in accordance with a hard-wired routine and a program resident in a small section 37 of the read-only memory (ROM) 38 of the component circuit. The microprocessor 35 and the registers 36, together with the section 37 of the ROM 38 storing the routine, are minimal insofar as the extent of circuitry involved and the area of the circuit region occupied. More especially, careful attention is paid during the design of the wafer, to ensure that the circuit density and topography are such that the likelihood of fault within the kernel logic section 32 is of a very low order; although not solely dependent on the area of the wafer, area is a factor as well as the type and quantity of circuitry used. In this latter regard, serial operation of the logic is preferred in order to minimize the amount of circuitry committed (the increased speed associated with parallel operation, is not generally required here).

Operation of the kernel logic section 32 to test the integrity of the component circuit of which it forms part, and, if good, to interconnect that circuit with other such circuits on the wafer, is initiated by response to an externally-applied condition. The response may be to the switching on of the power supply to the wafer, to the application of the master-clear signal MC to all the component circuits, or to a special signal superimposed on the clock lines. The special signal in the latter case may be, for example, an over-long pulse transmitted at the beginning of the train of normal-length clock pulses that continue while the wafer remains powered; if reconfiguration of the interconnections of the wafer circuits is required at any time during continuous operation of the wafer (possibly because of failure of a sub-circuit), this can be achieved in these circumstances, simply by retransmitting the over-long pulse to follow the masterclear signal MC, and thereby automatically re-start the testing procedure from the kernel logic section.

Once the testing routine of the kernel logic section 32 is initiated, the rest of the component circuit is tested part by part, in a progressively widening step-by-step process. The kernel logic section 32 initially carries out, according to the hard-wired program, simple tests on the words read one at a time from the ROM section 37, making check-sum tests and/or some form of signature analysis (using, for example, parity or cyclic-redundancy-code checks) to establish, albeit at a low level, indication of integrity of the sections 32 and 37; as a means of improving reliability of the integrity indication, provision may be made for the check-sum and/or analysis derived, to be compared with the corresponding results obtained in other component circuits.

Provided the basic testing has a satisfactory outcome, the kernel logic section 32 begins in accordance with the simple program stored in the ROM section 37, to test a wider portion 39 of the circuit. The portion 39 is delineated in FIG. 3 by broken line and includes more of the ROM 38 and brings in other sections of the logic part 31. The testing in this respect is generally to a more sophisticated level, and involves further check-sum, parity and cyclic redundancy checks, together with chain-code generation and checking. If the tests are satisfied, the kernel logic section 32 extends its testing further, beyond the portion 39, and for this utilizes the facilities just tested to add to its testing capabilities. More especially, its logic capabilities are extended to include the just-tested portion of the logic part 31, and to make use of further test program stored in the portion of the ROM 38 just tested.

The testing extends now beyond the boundary of the portion 39 to a wider portion 40 of the circuit, including more of the ROM 38 and logic part 31 together with a portion of a random-access memory (RAM) 41 of the component circuit. If the tests of this portion 40 are satisfied, then the testing is extended further in successive steps covering progressively-wider portions such as 42 and 43, of the circuit, so as to encompass the whole of the ROM 38, RAM 41 and logic part 31, and take in the functional part 30, until the whole of the component circuit (including the gating units 33 and 34) has been tested. At each stage of the step-by-step testing, control signals are derived within the kernel logic section 32 and elsewhere within the logic part 31 as this is progressively tested and found satisfactory, in dependence on the signal responses that occur within the circuitry being tested. These signals, which confirm (or otherwise) the integrity of the circuitry, build up a condition within the logic part 31 to represent the integrity status of the component circuit. Thus, from the kernel logic section 32, testing is carried out step by step over progressively larger portions of the component-circuit region to check the responses of the whole circuitry within the region, and result in a control-signal condition within the logic part 31 signifying the checked integrity.

If a fault is revealed in the tested circuitry at any stage of the step-by-step testing process, the kernel logic section 32 responds to this to terminate testing and to supply a control signal to each of the output gating units 33 inhibiting all output from the circuit. The faulty component circuit is thereby precluded from conveying signals to any other component circuit of the wafer, and in effect isolated as far as those other circuits are concerned. However, if the fault revealed is concerned with a portion or portions of the RAM 41 or logic part 31, isolation of the whole circuit in this way may not be necessary, and in this respect the logic section 32 and the remainder of the logic part 31 so far tested and found good, operate in accordance with program stored in the ROM 38 to reconfigure the RAM 41 or logic part 31, to exclude or mask the faulty portion or portions. Once this has been done, testing is resumed to complete checking of the whole combination circuit, towards assurance of its operative integrity.

After the component circuit has been tested and found satisfactory, testing can be extended into one or more adjacent circuits, so that the testing-capabilities of the circuit are now applied to checking beyond its own confines. These other circuits will have themselves already carried through a self-checking procedure, testing of all circuits having proceeded in parallel throughout the whole wafer. As the circuit tests these one or more other circuits, it will itself be being tested from another circuit, so that the outcome throughout the wafer will be to identify circuits that are nominally fault-free both as regards their own self-testing and the testing by others of those circuits (where there is conflict of verdict on any one of the circuits, this may be resolved by external circuitry).

The sequence or flow of the testing procedure can be summarized in the following steps:

1. kernel logic section 32 of each circuit initialised (master cleared) by externally-applied control signal—when completed proceed to step 2;

2. kernel logic section 32 reads program from ROM section 37 and carries out tests to check whether good
   if not, abort by inhibiting gating units 33
   if good, proceed to step 3;

3. kernel logic section 32 checks whether portion 39 is good
   if not, abort by inhibiting gating units 33
   if good, proceed to step 4;

4. kernel logic section 32 together with the remainder of portion 39, checks whether portion 40 is good
   if not, abort by inhibiting gating units 33
   if good, proceed to step 5;

5. kernel logic section 32 together with the remainder of portion 40, checks whether portion 42 is good
   if not, abort by inhibiting gating units 33
   if good, proceed to step 6;

6. kernel logic section 32 together with the remainder of portion 42, checks whether portion 43 is good
   if not, abort by inhibiting gating units 33
   if good, proceed to step 7;

7. kernel logic section 32 together with the remainder of portion 43, checks whether whole circuit is good
   if not, abort by inhibiting gating units 33
   if good, proceed to step 8;

8. the whole circuit, at the same time as obeying instructions from circuit to direction S, checks whether the circuit in the direction N is good
   if not, inhibit input gating unit 34 on N boundary and proceed to step 9
   if good, proceed to step 9;

9. the whole circuit, at the same time as obeying instructions from circuit to direction W, checks whether the circuit in the direction E is good
   if not, inhibit input gating unit 34 on E boundary and proceed to step 10
   if good, proceed to step 10;

10. the whole circuit, at the same time as obeying instructions from circuit to direction N, checks whether the circuit in the direction S is good
    if not, inhibit input gating unit 34 on S boundary and proceed to step 11
    if good, proceed to step 11;

11. the whole circuit, at the same time as obeying instructions from circuit to direction E, checks whether the circuit in the direction W is good
    if not, inhibit input gating unit 34 on W boundary and proceed to step 12
    if good, proceed to step 12;

12. await message from an adjacent circuit
    when received proceed to step 13;

13. determine whether the received message is global or addressed to a specific circuit or circuits
    if global, proceed to step 14
    if specific, proceed to step 15;

14. implement the instructions contained within the message and transmit the message on to adjacent circuits, then proceed to step 12;

15. if message received from:
    direction N, subtract 1 from N-S address direction W, subtract 1 from W-E address
direction S, add 1 to N-S address
direction E, add 1 to W-E address
and then proceed to step 16;

16. determine whether N-S and W-E addresses are both zero
if not, proceed to step 17
if yes, proceed to step 18;

17. transmit the message on to adjacent circuits and proceed to step 12;

18. implement the instruction contained within the message and proceed to step 12.

Implementation of the instruction called for in steps 14 and 18 above, may be carried through by the component circuit using one or more sub-routines stored in the circuit or called up from the external control unit.

Once the testing is completed, configuration logic within the logic parts 31 of the good circuits of the wafer, operate to interconnect those circuits with one another in array via the units 33 and 34; gaps in the array will exist where there are faulty circuits. It is unlikely, following the repeated testing to which each circuit has been submitted, that faulty circuit will attempt to connect itself into the array, since the testing of that circuit by other circuits will in general have revealed its fault—even if the fault has not been revealed earlier—and resulted in effective isolation of that circuit; the likelihood of a faulty circuit connecting itself into the array, may be reduced further by arranging that each circuit checks that adjacent pairs of circuits are good, before linking up with them.

The array of good circuits is interrogated from the external control unit (not shown) to derive in accordance with the control-signal conditions presented by the individual circuits, a mapping of the good circuits. From such a mapping the control unit can establish whatever reconfiguration of the interconnections are the most appropriate for the task to be performed. Provision may be made for the interconnections to be altered dynamically during operation if that is advantageous for programming purposes; full re-testing of the wafer will not generally be called for in these circumstances.

The control unit will in general need to be able to instruct each component circuit individually. This is achieved simply by including two address fields in each instruction, one containing a N-S address and the other an W-E address, and arranging for these field to be decremented or incremented according to the sense in which the message as transmitted into the array passes through each component circuit in turn. The N-S address is decremented by one within each circuit entered by the N boundary and incremented by one within each circuit entered by the S boundary, whereas the W-E address is decremented by one within each circuit entered by the W boundary and incremented by one within each circuit entered by the E boundary. The message continues to pass on within the array until it reaches a circuit in which it is detected that both addresses have been reduced to zero, namely the addressed circuit.

A third address field may be included to enable messages to be transmitted into the array for broadcast purposes to a certain number, for example forty, circuits of the array. The content of this field would indicate the number of circuits to receive the message, and would be decremented by one as the message enters each circuit in turn. The message would continue to be transmitted from one circuit to the next within the array, and each such circuit would respond to it, while the content of the third field remained positive. Global instructions applicable to all circuits of the array, or to all circuits of a particular column or row, could be signified by bit markers added to the head or tail of an address field. Furthermore, it would be possible to make provision for each message entering a circuit from one direction to be passed on from that circuit through each of its outputs in the other directions, that is to say, each message would be effectively triplicated in that circuit.

The speed of response of the array may be improved by the use of wires that extend across the wafer just above its surface and are bonded to the wafer circuitry at spaced intervals along their length. Such wires may extend above the wafer along their columns and/or rows of the circuit array, and may make connection with some or all of the circuits in those columns and/or rows for the purpose of supplying control signals and clock and reset pulses in parallel to the circuits of the array. Use of these bonded wires for signalling and clock and control pulse transmission avoids the delays normally control pulse transmission avoids the delays normally inherent in circuit-to-circuit transmission via the integrated-circuit conductors on the wafer. Such wires may also be used for the purposes of transmitting programs and data to the component circuits of the wafer, so that the amount of ROM storage required of each circuit can be significantly reduced. A modified form of the circuit of FIG. 3, illustrating the use of wires of this nature, will now be described with reference to FIG. 4.

Figure 4:
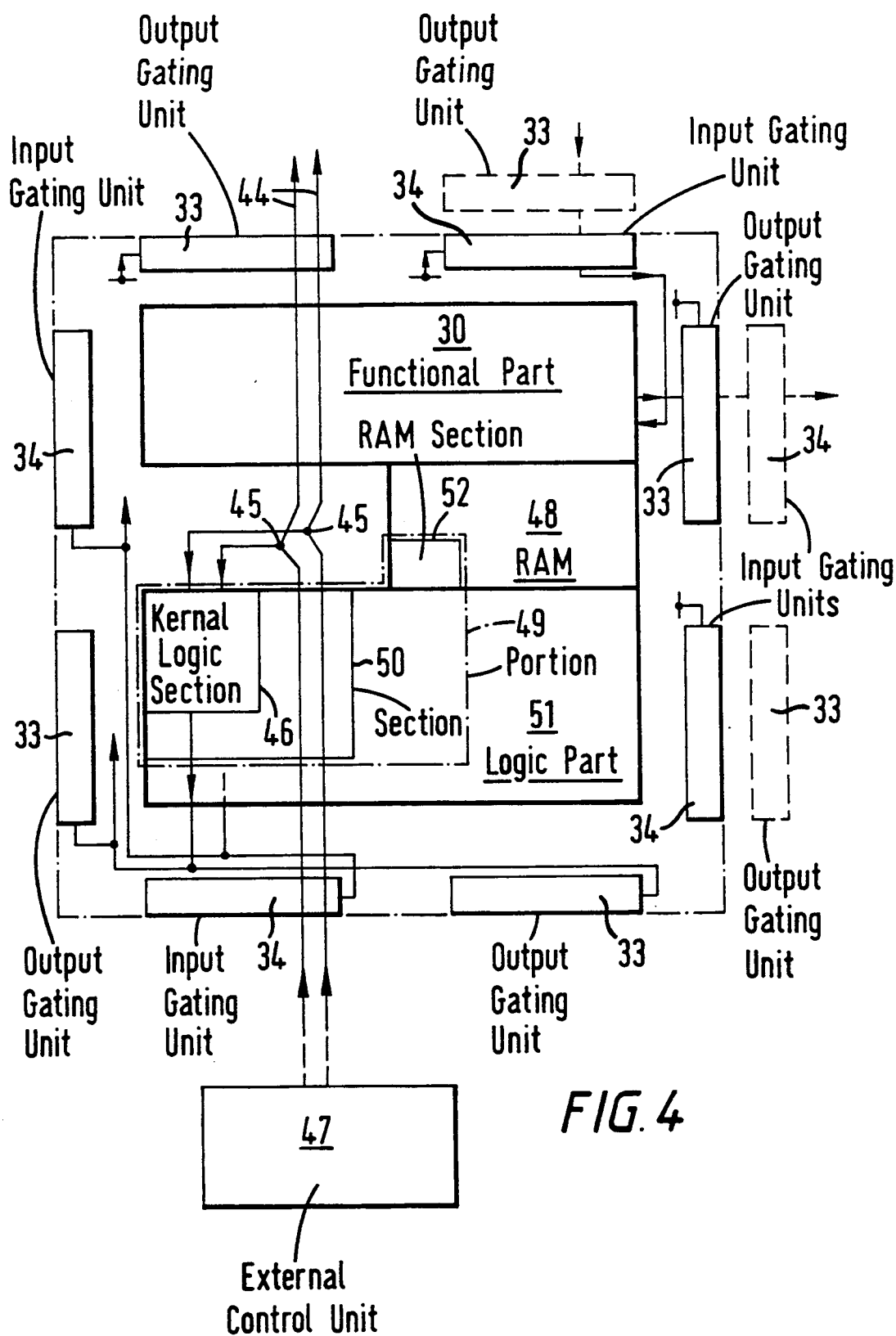
FIG. 4 serves to illustrate a modification of the component circuit of FIG. 3.

Referring to FIG. 4, parallel wires 44, both having a diameter of between 0.13 mm and 0.25 mm and being spaced from one another by 0.13 mm, extend along the circuit columns of the wafer, making connection with each circuit (or every second, third or fourth circuit) of the column. Each wire 44 is spaced above the wafer surface and descends to make connection with the wafer circuitry at a bond point 45 of the respective component circuit. Test programs and data are transmitted to the kernel logic section 46 of the circuit from an external control unit 47 via the wires 44, and are then stored in a RAM 48 for use through the testing procedure. The data may include test patterns and check results against which performance of the circuit is compared.

As shown by FIG. 4, ROM may be omitted from the component circuit. The portion 49 of circuitry which is in this case tested following the testing of the kernel logic section 46 itself, may include, in addition to a section 50 of the logic part 51, the section 52 of the RAM 48 that is to store the program and data received from the unit 47 via the wires 44. Moreover, the kernel logic section 46 may comprise a simple decision circuit which at this stage compares the results of processes performed by the logic section 50 using input data received from the wires 44, with predicted results of such processes supplied via the wires 44 by the control unit 47. The testing process carried out in this respect, may, for example, involve simply a step whereby the logic part 51 is instructed by the control unit 47 via the wires 44, to write data supplied via the wires 44 to specific addresses of the RAM 48, and is then instructed to read out data from those same addresses and compare it with a repeated transmission of the same data by the control unit 47. If the logic section 46 detects difference between the predicted results (in the latter example, the retransmitted data) and those actually achieved (the data read out from RAM), it signals this to indicate failure of the circuit to satisfy the test, to inhibit data output from the circuit, and to abort further testing.

The component circuits of the wafer, whether the modification of FIG. 4 is utilised or otherwise, may be associated with one another in pairs or groups of larger size, in such a way that there is a linking between them that facilitates their testing of one another, and favours their interconnection together; there may be advantage in having circuits of a linked pair laid down on the wafer, for example, as mirror images of one another. Moreover, the logic required for testing such a group may be shared between them, and in this respect, for example, a group of two or four circuits may be provided with a common kernel logic section which serves to initiate testing of the individual circuits in parallel with one another, and then collectively.

Although in the above description, the interconnection relationships between circuits has been described in the context of relating each circuit to four neighbouring circuits, one in each of the directions N, E, S and W, other such relationships are possible. For example, it would be possible to involve circuits in the four, intermediate, diagonal directions (NE, SE, SW and NW) also; where eight relationships are established in such a way, it may be found advantageous to arrange for the circuit to be capable of receiving signals from any four of the directions (for example, N, NW, W, and SW), and of supplying signals in the other four (for example, NE, E, SE and S). However, relationships involving circuits not physically adjacent to one another can be utilised.

I claim:

1. In an integrated circuit in which a multiplicity of semiconductor regions of a unitary substrate each contain a component circuit that is adapted to carry out a data function and to transfer signals to, and to receive signals from, others of the circuits, each component circuit includes means to derive a control condition in dependence upon signal responses that occur within the individual circuit according to the integrity of circuitry therein, and means to enable interconnections of the component circuit with others of said component circuits for the purposes of the transfer and reception of signals between them, in dependence upon the derived control condition, the improvement wherein each said region includes logic circuitry individual to the respective region and operable for determining circuit integrity within that region to derive said control condition in accordance therewith, and said logic circuitry in each region includes means for checking circuit integrity within the respective region by a process which comprises a plurality of successive testing steps that involve progressively extended portions of the region, said checking means comprising a kernel logic section and said process beginning from said kernel logic section without test of its integrity.

2. An integrated circuit according to claim 1 wherein said process provides that after each successive testing step is performed, circuitry of the portion of the region tested during that step, is included in the testing of the next portion to be tested.

3. An integrated circuit according to claim 1 wherein said kernel logic section is involved in each testing step of the process sequence.

4. An integrated circuit according to claim 3 wherein said kernel logic section comprises a microprocessor and registers.

5. An integrated circuit according to claim 3 wherein operation of said kernel logic section of the logic circuitry is serial.

6. An integrated circuit according to claim 1 wherein the logic circuitry of each said region comprises means to test the integrity of the circuitry of at least one other of said regions following completion of the testing of its own region.

7. An integrated circuit according to claim 1 wherein each region includes read-only memory, and means for reading program from the read-only memory, and wherein the logic circuitry of each region comprises means to act for at least part of the sequence of testing steps, in accordance with the program read from the read-only memory of its said region.

8. An integrated circuit according to claim 1 including program-supply means for supplying program signals to the logic circuitry of each region from outside said regions, and wherein the logic circuitry of each region comprises means to act for at least part of the sequence of testing steps, in accordance with program supplied to the said region via said program-supply means.

9. An integrated circuit according to claim 1 including means in each region to respond to the condition in which the integrity check is satisfied within that region to interconnect the component circuit of that region with the component circuits of other regions for which the integrity check is satisfied, this interconnection of the component circuits connecting them together in an array for transfer of signals to, and reception of signals from, one another in that array.

10. An integrated circuit according to claim 8 wherein said program-supply means comprises conductors bonded at intervals only, to the substrate.

11. An integrated circuit comprising a multiplicity of component-circuit means for carrying out data operations, each of said component circuit means including:
(a) logic circuitry which includes a logic section that is operable to carry through from itself a step-by-step integrity-checking process within the respective circuit means to derive in dependence upon the result of the process a control condition indicative of integrity of the individual circuit means; and
(b) configuration circuitry operable in response to said control condition to enable interconnection of the respective circuit means with others of said circuit means for signal interchange therewith,
  wherein the integrity-checking process performed by the logic section of each said circuit means comprises a sequence of steps in which the logic section is involved successively in checking the integrity of progressively larger portions of that circuit means, and each integrity-checking step involves checking the integrity of the subject portion of the circuit means against a criterion based on a premise of inherent integrity of said logic section.

12. An integrated circuit according to claim 11 wherein each logic section comprises a microprocessor and at least one register.

13. An integrated circuit according to claim 11 wherein each logic section includes a hard-wired program, and wherein the first step of the integrity-checking process includes exercise of said hard-wired program to check a first portion of said circuit means.

14. An integrated circuit according to claim 13 wherein each said circuit means includes a memory section, and the logic section of that circuit means is operative during said first step of the integrity-checking process to read out words from the memory section and to test them according to said hard-wired program.

15. An integrated circuit according to claim 14 wherein the logic section of each said circuit means is operative during at least the second step of said process to read integrity-testing program from the memory section of that circuit means, said logic section also being operative to apply this program to the testing of a portion of the circuit means which extends beyond said logic and memory sections.

16. An integrated circuit according to claim 11 wherein each said circuit means is an individual component circuit which comprises said logic circuitry, said configuration circuitry, functional circuitry for processing data, and memory means.

17. An integrated circuit according to claim 11 wherein each said circuit means comprises a plurality of component circuits, each said component circuit comprising logic means, circuit-configuration means for interconnecting the component circuit with others of said component circuits, functional circuitry for processing data, and memory means.

* * * * *